United States Patent
Yu et al.

(10) Patent No.: US 11,511,521 B2
(45) Date of Patent: Nov. 29, 2022

(54) INSULATED METAL SUBSTRATE AND METHOD FOR MANUFACTURING SAME

(71) Applicant: Polytronics Technology Corp., Hsinchu (TW)

(72) Inventors: Feng-Chun Yu, Yuanshan Township, Yilan County (TW); Kai-Wei Lo, Zhubei (TW); Wen Feng Lee, Taoyuan (TW); Ru-Yi Cai, Linluo Township, Pingtung County (TW)

(73) Assignee: POLYTRONICS TECHNOLOGY CORP., Hsinchu (TW)

( * ) Notice: Subject to any disclaimer, the term of this patent is extended or adjusted under 35 U.S.C. 154(b) by 0 days.

(21) Appl. No.: 17/306,196

(22) Filed: May 3, 2021

(65) Prior Publication Data

US 2022/0270950 A1     Aug. 25, 2022

(30) Foreign Application Priority Data

Feb. 25, 2021   (TW) .................................. 110106768

(51) Int. Cl.
| | | |
|---|---|---|
| *B32B 15/20* | (2006.01) | |
| *H01L 23/373* | (2006.01) | |
| *B32B 15/092* | (2006.01) | |
| *B32B 7/12* | (2006.01) | |

(Continued)

(52) U.S. Cl.
CPC ................ *B32B 15/20* (2013.01); *B32B 7/12* (2013.01); *B32B 15/092* (2013.01); *H01L 21/4807* (2013.01); *H01L 23/142* (2013.01); *H01L 23/3735* (2013.01); *B32B 2264/102* (2013.01); *B32B 2307/302* (2013.01); *B32B 2457/04* (2013.01); *B32B 2457/08* (2013.01)

(58) Field of Classification Search
CPC ......... B32B 15/20; B32B 7/12; B32B 15/092; B32B 2264/102; B32B 2307/302; B32B 2457/04; B32B 2457/08; H01L 21/4807; H01L 23/142; H01L 23/3735
See application file for complete search history.

(56) References Cited

U.S. PATENT DOCUMENTS

| | | | | |
|---|---|---|---|---|
| 2008/0211992 | A1* | 9/2008 | Tseng ..................... | H05K 1/021 349/69 |
| 2008/0304270 | A1* | 12/2008 | Ho ........................ | F21V 29/763 362/373 |
| 2014/0374649 | A1* | 12/2014 | Chen ..................... | C09J 109/02 252/75 |

FOREIGN PATENT DOCUMENTS

| | | | |
|---|---|---|---|
| JP | 2003243588 A | * | 8/2003 |
| TW | I391067 B1 | | 3/2013 |

* cited by examiner

*Primary Examiner* — John D Freeman
(74) *Attorney, Agent, or Firm* — Muncy, Geissler, Olds & Lowe, P.C.

(57) ABSTRACT

An insulated metal substrate (IMS) and a method for manufacturing the same are disclosed. The IMS includes an electrically conductive line pattern layer, an encapsulation layer, a first adhesive layer, a second adhesive layer, and a heat sink element. The encapsulation layer fills a gap between a plurality of electrically conductive lines of the electrically conductive line pattern layer. An upper surface of the encapsulation layer is flush with an upper surface of the electrically conductive line pattern layer. The first and second adhesive layer are disposed between the electrically conductive line pattern layer and the heat sink element. A bonding strength between the first adhesive layer and the second adhesive layer is greater than 80 kg/cm².

9 Claims, 6 Drawing Sheets

(51) Int. Cl.
*H01L 23/14* (2006.01)
*H01L 21/48* (2006.01)

INSULATED METAL SUBSTRATE AND METHOD FOR MANUFACTURING SAME

BACKGROUND OF THE INVENTION

(1) Field of the Invention

The present application relates to an insulated metal substrate, and more specifically, to an insulated metal substrate suitable for high power applications.

(2) Description of the Related Art

Generally, a commonly used thermal conductive board could be an insulated metal substrate (IMS) or a directed bonded copper (DBC) ceramic substrate. An electronic device, such as an integrated circuit (IC) chip, could be built on the thermal conductive board and is electrically coupled thereto to establish electrical connection therebetween. In operation, the electronic device generates heat which gradually accumulates on the device as time goes on. Heat could be either dissipated upwards via a metal conductive line pattern on surface of the board towards the above ambient environment, or dissipated downwards from the thermal conductive board to the below space. In other words, the thermal conductive board serves as a heat dissipation medium.

Although DBC ceramic substrate can endure temperature as high as over 1000° C., ceramic is brittle and fragile, it is difficult for DBC ceramic substrate to undergo mechanical engineering process such as drilling and/or cutting process during manufacturing process thereof. In addition, since a copper foil and a ceramic layer differs significantly in coefficient of thermal expansion (CTE) from each other, for thick copper foil applications (e.g., a copper foil having a thickness of 0.3-10 mm), it is very likely that, at high temperature, delamination between the copper foil and the ceramic layer occurs.

IMS uses polymer as a matrix material in a thermally conductive and electrically insulating layer of the IMS, wherein a large amount of heat conductive fillers are evenly dispersed in this layer. Two metal foils are coupled to upper and lower surfaces of the thermally conductive and electrically insulating layer, respectively, to form a thermal conductive board being of a laminated structure. It is known that it is much easier for polymer, in compassion with ceramic, to be subject to mechanical engineering process. Also, the thermally conductive and electrically insulating layer of the IMS is more tightly bonded with the metal foil, it is unlikely that delamination occurs therebetween.

Currently, there are more and more high power applications like Internet of Things (IoT) or high speed calculation, and power output from the electronic devices is much higher than before. Thus, recently, thermal management becomes a thorny problem. In such case, thermal conductive board needs to use thicker copper foil to facilitate heat conduction along both horizontal direction and vertical direction of the copper foil, so that, afterwards, heat could be dissipated to ambient environment to achieve effective heat dissipation. However, as said above, DBC ceramic substrate have problems of delamination at high temperature and difficulty in mechanical engineering process. Therefore, for such high power applications which requires thick copper foil, IMS has replaced DBC ceramic substrate to be used as a thermal conductive board.

US Patent Publication No. US2020/0229303A1 discloses a method for manufacturing an IMS having a polymeric insulation layer. Firstly, a plurality of electrically conductive metal blocks are formed, Next, these electrically conductive metal blocks are disposed on an insulation layer of a metal substrate, where the metal substrate functions to dissipate heat and is formed to have a shape of a fin to realize heat dissipation. Then, a hot-pressing step is performed to obtain the IMS. However, according to this method, these electrically conductive metal blocks cannot be accurately disposed on the insulation layer, thus resulting in misalignment problem. Moreover, in order to be used in high power applications, the heat dissipation fin must have protrusions for increasing heat dissipation area. Thus, the heat dissipation fin is not a metal plate with a uniform thickness, but a plate having a plurality of protrusions on surface thereof. Such structure design makes the hot presser, during the hot-pressing step, cannot apply a uniform pressure on entire upper surface of the heat dissipation fin. As a result, after hot-pressing is completed, bonding strength between layers of IMS is poor. In particular, if IMS is used in extremely poor environment like high temperature and high humidity conditions, occurrence of separation or peeling between layers is common, and this cause serious issue.

Accordingly, there is a need to provide a method for manufacturing IMS.

SUMMARY OF THE INVENTION

To solve aforementioned problems, the present invention provides an insulated metal substrate (IMS) and a method for manufacturing the same. The layers in the IMS do no separate from each other, and the misalignment problem can be avoided. The IMS of the present invention has excellent heat conductivity and high glass transition temperature Tg, thus being particularly suitable for high power applications that requires thick copper layer.

In accordance with a first aspect of the present application, the present application provides an insulated metal substrate. The insulated metal substrate comprises an electrically conductive line pattern layer, an encapsulation layer filling a gap between a plurality of electrically conductive lines of the electrically conductive line pattern layer, wherein an upper surface of the encapsulation layer is flush with an upper surface of the electrically conductive line pattern layer; a first adhesive layer; a second adhesive layer; and a heat sink element disposed below the electrically conductive line pattern layer and the encapsulation layer. The first adhesive layer and the second adhesive layer are disposed between the electrically conductive line pattern layer and the heat sink element. The first adhesive layer physically contacts the electrically conductive line pattern layer and the encapsulation layer. The second adhesive layer physically contacts the heat sink element. The first adhesive layer physically contacts the second adhesive layer. A bonding strength between the first adhesive layer and the second adhesive layer is greater than 80 kg/cm$^2$.

In an embodiment, the electrically conductive line pattern layer comprises copper, and has a thickness of 0.3-10 mm.

In an embodiment, a bonding strength between the first adhesive layer and the electrically conductive line pattern layer is greater than 80 kg/cm$^2$, and a bonding strength between the second adhesive layer and the heat sink element is greater than 80 kg/cm$^2$.

In an embodiment, each of the first adhesive layer and the second adhesive layer has a glass transition temperature Tg greater than 150° C.

In an embodiment, each of the first adhesive layer and the second adhesive layer has a thickness of 25-100 μm, and the bonding strength between the first adhesive layer and the second adhesive layer falls within the range of 80-300 kg/cm².

In an embodiment, the first adhesive layer and the second adhesive layer have a same or different composition.

In an embodiment, both the first adhesive layer and the second adhesive layer are made from an adhesive material, the adhesive material comprising:

a polymeric component comprising 15-60% by volume of the adhesive material, and comprising thermoset epoxy resin and polymeric modifier configured to improve impact resistance of the thermoset epoxy resin, the polymeric modifier comprising thermoplastic, rubber or the mixture thereof; and the polymeric modifier comprising 4%-45% by volume of the polymeric component;

a heat conductive filler evenly dispersed in the polymeric component, and comprises 40-85% by volume of the adhesive material;

a curing agent configured to cure the thermoset epoxy resin at a temperature higher than 120° C.; and a curing accelerator including urea or urea compounds;

wherein the adhesive material has a heat conductivity greater than 3 W/m-K.

In an embodiment, the adhesive material in the form of a plate with a thickness of 100 μm has a thermal resistance below 0.5° C./W and withstands 500 volts or more.

In an embodiment; the heat conductive filler comprises one or more ceramic powders.

In an embodiment, the heat conductive filler is selected from the group consisting of zirconium nitride, boron nitride, aluminum nitride, silicon nitride, aluminum oxide, magnesium oxide, zinc oxide, silicon oxide, titanium oxide and the mixture thereof.

In an embodiment, the heat sink element comprises a main plate and a plurality of protrusions, and the protrusions project outwardly along a direction that is vertical to an extending direction of the main plate.

In accordance with a second aspect of the present application, the present application provides a method for manufacturing an insulated metal substrate, comprising: providing a thermal conductive substrate including a metal base, a first adhesive layer and a metal layer from bottom to top; removing a portion of the metal layer to form an electrically conductive line pattern layer, such that a portion of the first adhesive layer is exposed; forming an encapsulation layer on the electrically conductive line pattern layer, the encapsulation layer filling a gap between a plurality of electrically conductive lines of the electrically conductive line pattern layer; removing a top portion of the encapsulation layer, so that an upper surface of the encapsulation layer is flush with an upper surface of the electrically conductive line pattern layer; removing the metal base; providing a heat sink element with a second adhesive layer disposed on the heat sink element; and bonding the second adhesive layer to the first adhesive layer, whereby a physical contact is established between the first adhesive layer and the second adhesive layer, and a bonding strength between the first adhesive layer and the second adhesive layer is greater than 80 kg/cm².

In an embodiment, the electrically conductive line pattern layer comprises copper, and has a thickness of 0.3-10 mm.

In an embodiment, Computer Numerical Control (CNC) is used to remove the portion of the metal layer.

In an embodiment, the encapsulation layer is formed by infusion, screen printing, ink injection or injection molding, and the encapsulation layer comprises an insulation material selected from Epoxy Molding Compound (EMC), solder mask, thermal conductive ink, epoxy resin, polyetheretherketone (PEEK) or polyethersulfone (PES).

In an embodiment, the heat sink element comprises a main plate and a plurality of protrusions, and the protrusions project outwardly along a direction that is vertical to an extending direction of the main plate.

In an embodiment, each of the first adhesive layer and the second adhesive layer has a glass transition temperature Tg greater than 150° C.

In an embodiment, after the bonding step, a bonding strength between the first adhesive layer and the electrically conductive line pattern layer is greater than 80 kg/cm², and a bonding strength between the second adhesive layer and the heat sink element is greater than 80 kg/cm².

In an embodiment, each of the first adhesive layer and the second adhesive layer has a thickness of 25-100 and the bonding strength between the first adhesive layer and the second adhesive layer falls within the range of 80-300 kg/cm².

In an embodiment, the method further comprises a step of disposing a complementary jig on the heat sink element to bond the second adhesive layer to the first adhesive layer.

In an embodiment, the first adhesive layer and the second adhesive layer have a same or different composition.

In an embodiment, both the first adhesive layer and the second adhesive layer are made from an adhesive material, the adhesive material comprising:

a polymeric component comprising 15-60% by volume of the adhesive material, and comprising thermoset epoxy resin and polymeric modifier configured to improve impact resistance of the thermoset epoxy resin, the polymeric modifier comprising thermoplastic, rubber or the mixture thereof; and the polymeric modifier comprising 4%-45% by volume of the polymeric component a heat conductive filler evenly dispersed in the polymeric component, and comprises 40-85% by volume of the adhesive material;

a curing agent configured to cure the thermoset epoxy resin at a temperature higher than 120° C.; and a curing accelerator including urea or urea compounds;

wherein the adhesive material has a heat conductivity greater than 3 W/m-K.

In an embodiment, the adhesive material in the form of a plate with a thickness of 100 μm has a thermal resistance below 0.5° C./W and withstands 500 volts or more.

According to the present invention, an insulated metal substrate (IMS) and a method for manufacturing the same are disclosed. The present invention can avoid the misalignment problem, and there is no issue of layer delamination. In addition, the IMS has excellent heat conductivity and high glass transition temperature Tg. Accordingly, the present invention is particularly suitable for high power applications, thus providing a solution to the traditional IMS which encounters the problems as described above.

BRIEF DESCRIPTION OF THE DRAWINGS

The present application will be described according to the appended to drawings in which.

DETAILED DESCRIPTION OF THE INVENTION

The making and using of the presently preferred illustrative embodiments are discussed in detail below. It should be appreciated, however, that the present application provides many applicable inventive concepts that can be embodied in a wide variety of specific contexts. The specific illustrative embodiments discussed are merely illustrative of specific ways to make and use the invention, and do not limit the scope of the invention.

Figure 1:
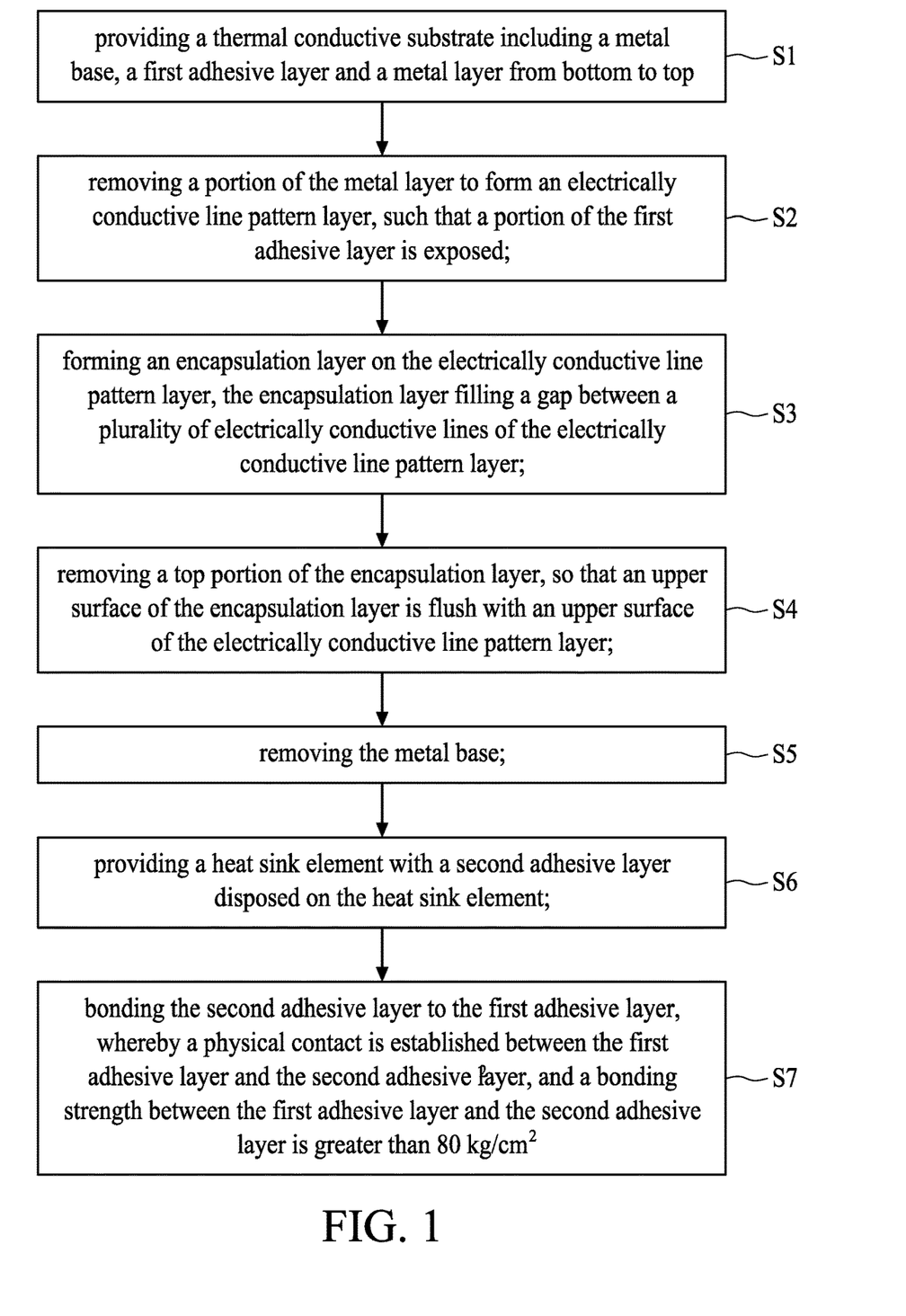
FIG. 1 shows a flowchart of a method for manufacturing an IMS in accordance with an embodiment of the present invention.

FIG. 1 shows a flowchart of a method for manufacturing an IMS in accordance with an embodiment of the present invention. The method includes the following steps. In step S1, a thermal conductive substrate is provided, which includes a metal base, a first adhesive layer and a metal layer from bottom to top. In step S2, a portion of the metal layer is removed to form an electrically conductive line pattern layer, such that a portion of the first adhesive layer is exposed. In step S3, an encapsulation layer is formed on the electrically conducive line pattern layer, the encapsulation layer filling a gap between a plurality of electrically conductive lines of the electrically conductive line pattern layer. In step S4, a top portion of the encapsulation layer is removed, so that an upper surface of the encapsulation layer is flush with an upper surface of the electrically conductive line pattern layer, or the encapsulation layer has the same height as that of the electrically conductive line pattern layer. In step S5, the metal base is removed. In step S6, a heat sink element is provided with a second adhesive layer being disposed on the heat sink element. In step S7, the second adhesive layer is bonded to the first adhesive layer, whereby a physical contact is established between the first adhesive layer and the second adhesive layer, and a bonding strength between the first adhesive layer and the second adhesive layer is greater than 80 kg/cm$^2$.

An adhesive material used to form the adhesive layer is prepared by including plural ingredients to have a heat conductivity greater than 3 W/m-K, and the adhesive material in the form of a plate with a thickness of 100 μm has a thermal resistance below 0.5° C./W which is measured according to ASTM 5470. Moreover, the adhesive material is insulative and can withstand 500 volts or more. In addition, a bonding strength between the adhesive layer and the metal plate is greater than 80 kg/cm$^2$, and a bonding strength between two adjacent adhesive layers is greater than 80 kg/cm$^2$ as well. The adhesive layer has a glass transition temperature Tg greater than 150° C. Therefore, the present invention is particularly suitable for high power applications. Further, the present invention uses Computer Numerical Control (CNC) to remove a portion of the metal layer, thus effectively avoiding misalignment problem and increasing product yield. The method for manufacturing the IMS is described in detail below.

Figure 2A:
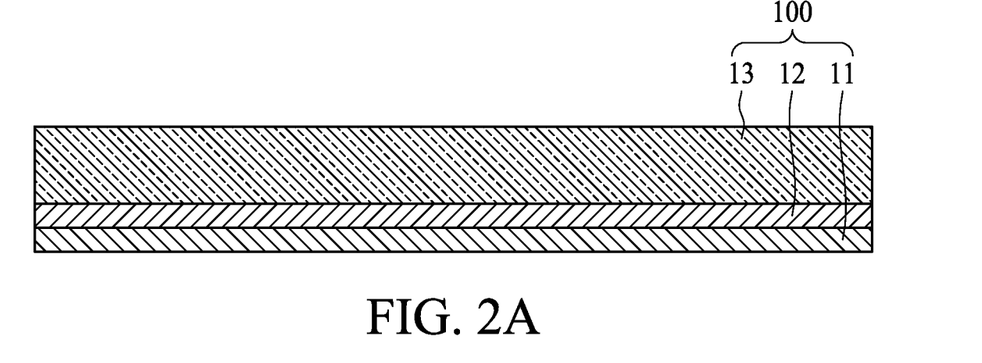
FIGS. 2A-2G show cross-sectional views in each stage of the method of FIG. 1 for manufacturing an IMS.

Please see FIGS. 2A-2G, which are cross-sectional views in each stage of the method of FIG. 1 for manufacturing an IMS. Please also refer to the flowchart in FIG. 1. As shown in FIG. 2A, in step S1, a thermal conductive substrate 100 is provided, Which includes a metal base 11, a first adhesive layer 12 and a metal layer 13 from bottom to top. In an embodiment, the thermal conductive substrate 100 generally has a shape of a plate. The first adhesive layer 12 is disposed between the metal base 11 and the metal layer 13. A downside and an upside of the first adhesive layer 12 contact the metal base 11 and the metal layer 13, respectively. In an embodiment, the metal layer 13 may comprise copper, the metal base 11 may comprise copper or aluminum, in other embodiments, the metal layer 13 and the metal base 11 may comprise other metal materials. The first adhesive layer 12 include a polymer and a large amount of heat conductive fillers evenly dispersed in the polymer, and therefore it is suitable for being used for bonding metal components. The metal components may comprise copper, aluminum, nickel, iron, tin, gold, silver or alloy thereof. The metal base 11, the first adhesive layer 12 and the metal layer 13 may be hot-pressed to form a sandwich structure. After being hot-pressed, the bonding strength between the first adhesive layer 12 and the metal layer 13 in the sandwich structure is greater than 80 kg/cm$^2$, or greater than 1.00 kg/cm$^2$ or 120 kg/cm$^2$ in particular. For use in high power applications, the metal layer 13 has to be thick enough, e.g. at least to an extent, so as to effectively realize heat dissipation function. Heat generated by the electronic device could be dissipated upwards to the above ambient environment via the metal layer 13. In an embodiment, the metal layer 13 comprises copper, and has a thickness of 0.3-10 mm, such as 0.5 mm, 1 mm, 2 mm, 3 mm, 4 mm, 5 mm, 6 mm, 7 mm, 8 mm or 9 mm, Because the metal base 11 is used as a base plate for hot-pressing process, it will be removed once hot-pressing is completed, and there is no necessary for it to have a too thick thickness. In an embodiment, the metal base 11 is made of copper, and has a thickness of 35-300 μm, such as 70 μm, 105 μm, 140 μm 175 μm, 210 μm, 245 μm or 270 μm.

Figure 2B:
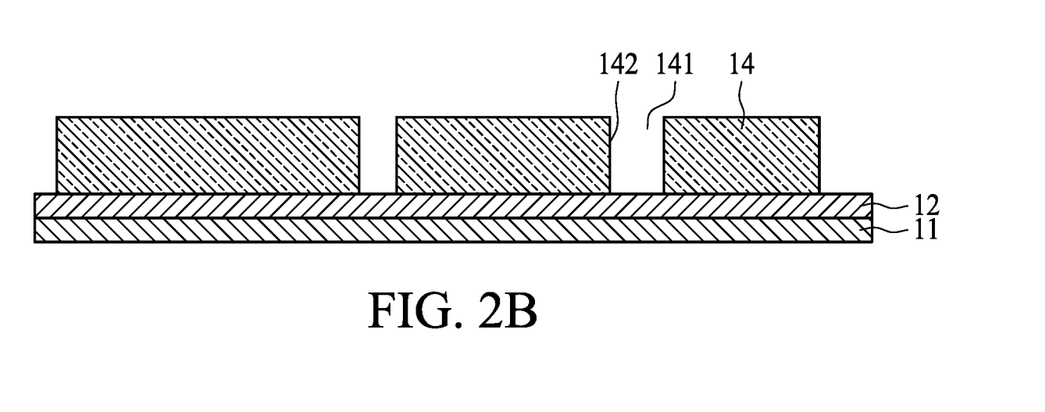

Next, please see FIG. 2B. In step S2, a portion of the metal layer 13 is removed to form an electrically conductive line pattern layer 14, such that a portion of the first adhesive layer 12 is exposed. The metal layer 13 could be removed by any mechanical way or wet etching. For example, Computer Numerical Control (CNC) is used with a rotary cutter to remove the portion of the metal layer 13. In this way, a plurality of electrically conductive lines 142 will be formed on top surface of the first adhesive layer 12. The electrically conductive lines 142 may include metal pads (not shown) for establishing electrical connection with the electronic devices at a later manufacturing step. Specifically, after a portion of the metal layer 13 is removed, a gap 141 is formed between adjacent electrically conductive lines 142, thus exposing a portion of the first adhesive layer 12. The electrically conductive lines 142 may include metal pads which are to be electrically connected to the electronic devices. According to the present invention, because the electrically conductive lines 142 are formed using CNC, it is quite easy to precisely target those sites where the electrically conductive lines 142 are to be formed. In comparison with prior art where the electrically conductive metal blocks are formed first and then these electrically conductive metal blocks are disposed on the insulation layer, the present invention avoids misalignment problem. Because, generally, CNC process will also produce metal tailings along with formation of the electrically conductive line pattern layer 14, wet etching technique may be used to eliminate the metal tailings after formation of the electrically conductive line pattern layer 14.

Figure 2C:
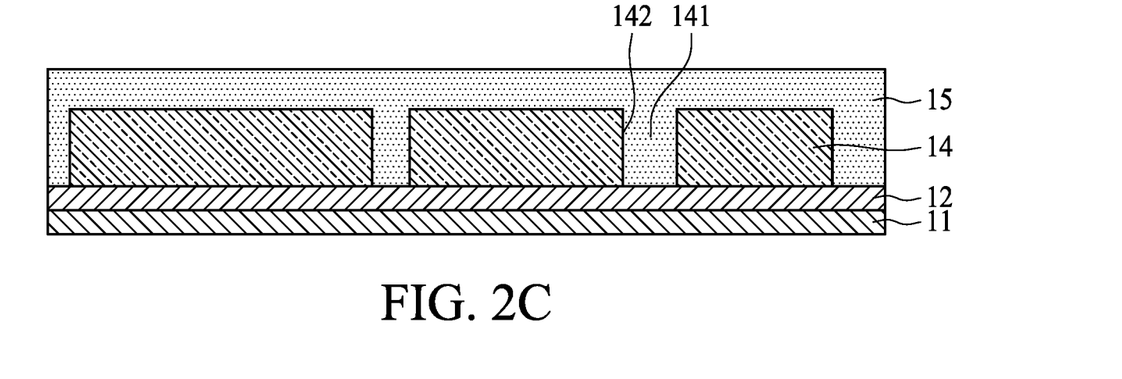

As shown in FIG. 2C, in step S3, an encapsulation layer 15 is formed on the electrically conductive line pattern layer 14, the encapsulation layer 15 filling the gap 141 between the electrically conductive lines 142 of the electrically conductive line pattern layer 14. The encapsulation layer 15 functions to prevent water and/or oxygen from entering the IMS, which may adversely influence electrical properties of IMS. The encapsulation layer 15 comprises an insulation material, and could be formed by infusion, screen printing, ink injection, or injection molding. As an example, Epoxy Molding Compound (EMC) may be infused into a mold to form the encapsulation layer 15. In another embodiment, screen printing may be used to print the solder mask on the electrically conductive line pattern layer 14, thereby forming the encapsulation layer 15 on top surface thereof. In a further embodiment, thermal conductive ink is injected and coated on the electrically conductive line pattern layer 14 to form the encapsulation layer 15. In a yet further embodiment, injection molding technique is used to provide an insulation material, including but not limited to epoxy resin, polyetheretherketone (PEEK) or polyethersulfone (PES), on the electrically conductive line pattern layer 14 to form the encapsulation layer 15. It should be understood that the material of the encapsulation layer 15 and the method for forming the encapsulation layer 15 are not limited to these examples. Usually, the encapsulation layer 15 formed by these methods has a thickness greater than that of the electrically conductive line pattern layer 14. In other words, the encapsulation layer 15 covers an entirety of the electrically conductive line pattern layer 14 and also fills the gap 141 between the electrically conductive lines 142.

Figure 2D:
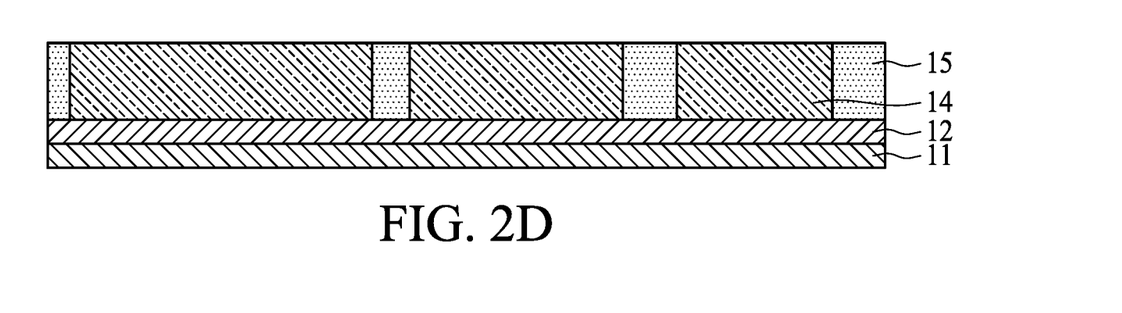

As shown in FIG. 2D, in step S4, a top portion of the encapsulation layer 15 is removed, so that an upper surface of the encapsulation layer 15 is flush with an upper surface of the electrically conductive line pattern layer 14, or the encapsulation layer 15 has the same height as that of the electrically conductive line pattern layer 14. Since the thickness of the encapsulation layer 15 is greater than that of the electrically conductive line pattern layer 14, there is a need to remove the top portion of the encapsulation layer 15. For example, chemical mechanical polishing (CMP) may be used to proceed abrasion of top portion of the encapsulation layer 15. As a result, the encapsulation layer 15 will have a same height as that of the electrically conductive line pattern layer 14.

Figure 2E:
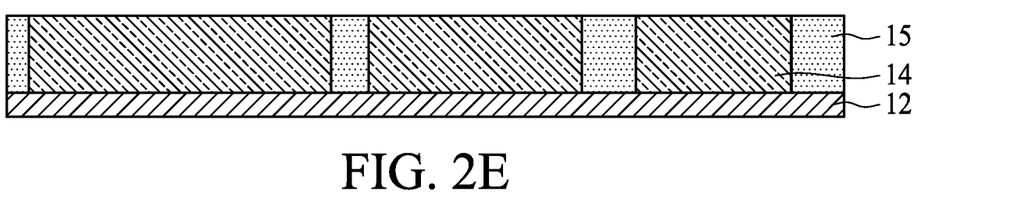

FIG. 2E shows that, in step S5, the metal base 11 is removed. As described above, the metal base 11 serves as a base plate for hot-pressing; process, it has to be removed once hot-pressing is completed. In an embodiment, the metal base 11 may be removed by wet etching, dry etching, or chemical mechanical polishing (CMP).

Figure 2F:
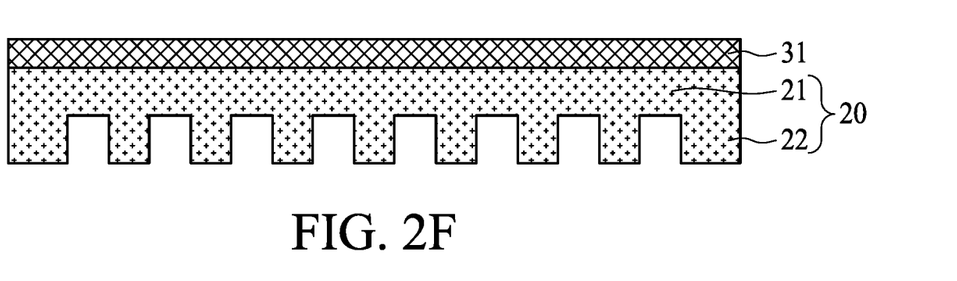

As shown in FIG. 2F, in step S6, a heat sink element 20 is provided with a second adhesive layer 31 being disposed on the heat sink element 20. The heat sink element 20 functions to dissipate heat from electronic devices towards ambient environment. The heat sink element 20 could be made of any material having superior heat conductivity, e.g., metal, including aluminum, copper, nickel, iron, tin, gold, sifter or alloy thereof, or could comprise those material containing carbon like graphite or composite components having graphite. For high power applications, the outer surface of the heat sink element 20 should have as large area as possible to increase heat dissipation area and thus raise heat dissipation efficiency. For this reason, the heat sink element 20 generally includes a main plate 21 and a plurality of protrusions 22. The protrusions 22 project outwardly along a direction that is vertical to an extending direction of the main plate 21. The protrusions 22 could be in shape of cylinder, elliptic cylinder, polygonal column, truncated cone, or flat plate. In addition, there is a gap between the protrusions 22 to accommodate air to flow therein, so as to carry heat away. In the present embodiment, each of the protrusions 22 is in shape of a rectangular plate, and all the rectangular plates are parallel to each other and are separated from each other with a constant interval. In other embodiments, the heat sink element 20 could include the main plate 21 solely, that is, without the protrusions 22. The main plate 21 in this case is thicker than that of the heat sink element 20 including protrusions 22. The main plate 21 having thicker thickness in this case may facilitate heat conduction along both horizontal direction and vertical direction of the main plate 21, so that, afterwards, heat could be efficiently and effectively dissipated to ambient environment to accomplish heat dissipation function.

The second adhesive layer 31 may have the same composition as the first adhesive layer 12. That is, they have the same ingredients, and the volume percentages of these ingredients are the same. Alternatively, the second adhesive layer 31 may have a composition different from that of the first adhesive layer 12. That is, they have different ingredients, or the volume percentage of these ingredients are different. Nevertheless, because both of the first adhesive layer 12 and the second adhesive layer 31 include a polymer and a large amount of heat conductive fillers evenly dispersed in the polymer, and both of them are suitable for bonding metal components, the first adhesive layer 12 and the second adhesive layer 31 have quite similar composition even if the compositions thereof are different. The bonding property, heat conductivity and insulative property of the two lavers are approximately similar. Regarding this, it will be described in detail below.

Figure 2G:
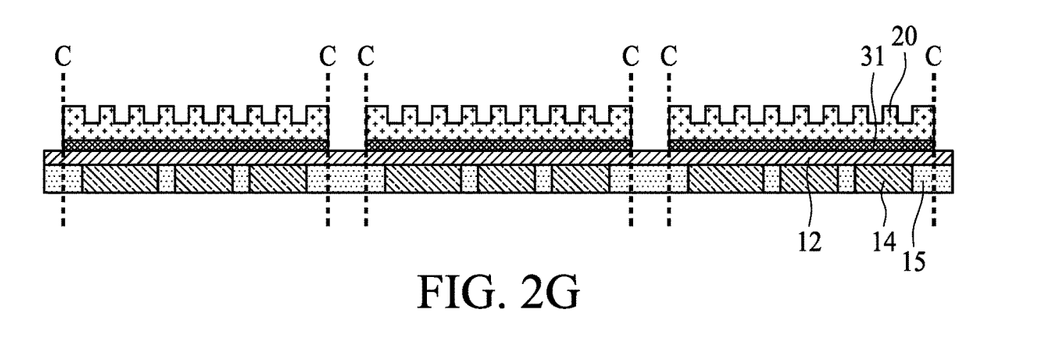

Thereafter, please see FIG. 2G, which shows that, in step S7, the second adhesive layer 31 is bonded to the first adhesive layer 12, whereby a physical contact is established between the first adhesive layer 12 and the second adhesive layer 31, and a bonding strength between the first adhesive layer 12 and the second adhesive layer 31 is greater than 80 kg/cm$^2$. The step S7 could be achieved by hot-pressing. Specifically, in the hot-pressing process, the electrically conductive line pattern layer 14 and the encapsulation layer 15 are located at bottom portion of the hot-pressing space, while the heat sink element 20 is provided on the surface of the first adhesive layer 12, as shown in FIG. 2G, such that, after hot-pressing, an interface is formed between the first adhesive layer 12 and the second adhesive layer 31. Once hot-pressing is completed, the second adhesive layer 31 and the heat sink element 20 are bonded to each other, with the bonding strength therebetween greater than 80 kg/cm$^2$, 100 kg/cm$^2$, or 120 kg/cm$^2$. Also, the second adhesive layer 31 and the first adhesive layer 12 are bonded to each other. As said above, because the second adhesive layer 31 and the first adhesive layer 12 have the same or similar composition, hot-pressing applies a pressure to tightly bond the two layers together. Such superior bonding strength would be much greater than that between an adhesive layer and a metal layer. The inventors find from experiments that the bonding strength between the first adhesive layer 12 and the second adhesive layer 31 is greater than 80 kg/cm$^2$, such as falling within the range of 80-300 kg/cm$^2$, or 100 kg/cm$^2$, 150 kg/cm$^2$, 200 kg/cm$^2$, or 250 kg/cm$^2$ in particular. Therefore, though protrusions 22 of the heat sink element 20 may make it difficult for the hot presser to uniformly apply a pressure on the topmost surface of the heat sink element 20 (i.e., the upper surface of the heat sink element 20 shown in FIG. 2G), superior bonding strength would not cause separation of the heat sink element 20.

The first adhesive layer 12 and the second adhesive layer 31 cannot have a too thick or too thin thickness. A too thick thickness would increase thermal resistance. A too thin thickness would not have good voltage endurance, and the bonding strength between the two adhesive layers is not large enough for use in IMS's applications. In an embodiment, each of the first adhesive layer 12 and the second adhesive layer 31 has a thickness of 25-100 μm. As long as hot-pressing is finished, the first adhesive layer 12 and the second adhesive layer 31 together constitute a thermally conductive and electrically insulating layer. In other words, the thermally conductive and electrically insulating layer includes a first adhesive layer 12 and a second adhesive layer 31, and has a thickness falling within 50-200 μm.

Figure 4:
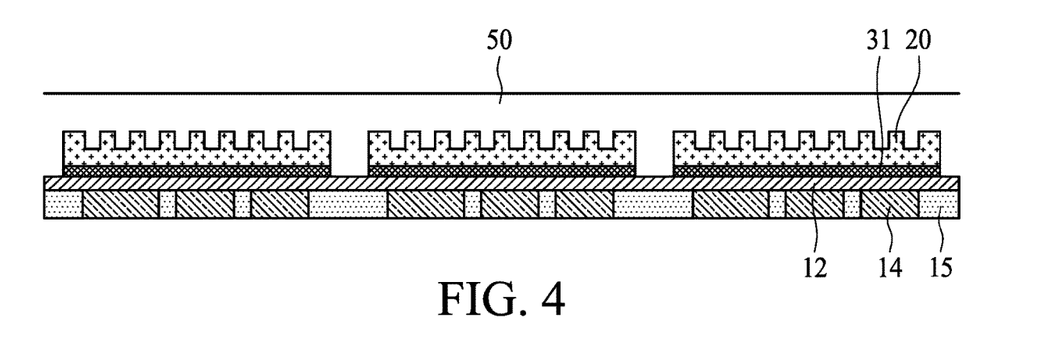
FIG. 4 is a schematic diagram showing a hot-pressing step for manufacturing an IMS in accordance with an embodiment of the present invention.

In an embodiment, as shown in FIG. 4, it is preferred to use a complementary jig 50 to perform the hot-pressing process. The so-called "complementary jig" is a jig where the surface of the jig has a topography the is complementary to the topography of the surface of the heat sink element 20. Thus, the complementary jig 50 matches with the heat sink element 20 when contacting each other. During hot-pressing, the complementary jig 50 is disposed on the heat sink element 20 with no gap therebetween, as shown in FIG. 4, to together form a plate body having a uniform thickness. Thereby, the hot presser may uniformly apply a pressure on the topmost surface of the heat sink element 20. Use of the complementary jig 50 during hot-pressing may therefore increase the bonding strength between layers of IMS further.

In the step S7 of FIG. 2G, if plural heat sink elements 20 are pressed at the same time (as shown in FIG. 2G in which three heat sink elements 20 are pressed), the method may further include a cutting step. Taking the embodiment of FIG. 2G as an example, a cutting step is carried out after hot-pressing by using a cutter to cut along the cutting lines C, such that the IMS is cut into pieces to obtain the final products. However, if there is only one heat sink elements 20 pressed in this step, the cutting step is not necessary and is omitted. Depending on product design and/or tri manufacturing process thereof, the additional cutting step could be either included or not. After hot-pressing and cutting steps are finished, the IMS 300 has a final product with its structure shown in FIG. 3.

To have excellent heat conductivity and electrical property and to meet the demand of required bonding strength, the first adhesive layer 12 and the second adhesive layer 31 are both made from an adhesive material. The adhesive material of the present application comprises a polymeric component, a heat conductive filler, a curing agent and a curing accelerator. The polymeric component comprises 15-60% by volume of the adhesive material, and comprises thermoset epoxy resin and polymeric modifier configured to improve impact resistance of the thermoset epoxy resin. The polymeric modifier comprises thermoplastic, rubber or the mixture thereof. The polymeric modifier comprises 4-45% by volume of the polymeric component. The heat conductive filler is evenly dispersed in the polymeric component, and comprises 40-85% by volume of the adhesive material.

The heat conductivity of the adhesive material is about 3-15 W/m-K, e.g., 5 W/m-K, 7 W/m-K, 10 W/m-K or 12 W/m-K. The adhesive material in the form of a plate with a thickness of 100 μm has a thermal resistance below 0.5° C./W or 0.4° C./W, which is measured according to ASTM 5470. The adhesive material has a hardness between 65-98A, e.g., 75A, 85A or 95A, which is measured according to ASTM D2240. As such, the adhesive material has good impact resistance, and therefore it is suitable for bonding metal components. The metal components may comprise copper, aluminum, nickel, iron, tin, gold, silver or alloy thereof. In an embodiment, the strength of the adhesive material bonding to the metal component is greater than 80 kg/cm$^2$ after the adhesive material is pressed and cured. It is obvious that the addition of thermoplastic can increase adhesive strength, by which the adhesive material becomes tough but not fragile. Therefore, the adhesive material is able to be strongly and firmly adhered to metal components such as metal electrodes or substrates. The adhesive strength may be larger than 100 kg/cm$^2$ or 120 kg/cm$^2$. Preferably, the adhesive material in the form of a plate with a thickness of 100 μm has a thermal resistance below 0.5° C./W. Moreover, the adhesive material is insulative and can withstand a voltage higher than 500 volts, e.g., 600 volts, 800 volts, 1000 volts, 1200 volts, 1400 volts, 1600 volts, 1800 volts, 2000 volts or more. In addition, the adhesive layers 12 and 31 made from the adhesive material has a glass transition temperature Tg greater than 150° C., such as in the range of 150-380° C.

In the step S7 of FIG. 2G, the thermally conductive and electrically insulating layer formed after hot-pressing includes the first adhesive layer 12 and the second adhesive layer 31. A thermal resistance of the thermally conductive and electrically insulating layer is equivalent to a thermal resistance of a plate made from the adhesive material with the same thickness as that. For example, in the case that the first adhesive layer 12 and the second adhesive layer 31 each has a thickness of 50 urn, the thermal resistance of the thermally conductive and electrically insulating layer with a thickness of 100 μm is equivalent to the thermal resistance of a plate made from the adhesive material with a thickness of 100 μm.

The thermoset epoxy resin can include end epoxy functional group epoxy resin, side chain epoxy functional group epoxy resin, tetra-functional group epoxy resin or the mixture thereof. For example, the thermoset epoxy resin includes bisphenol A epoxy resin.

The thermoplastic of the adhesive material may be essentially amorphous thermoplastic resin, such as phenoxy resin, polysulfone, polyethersulfone, polystyrene, polyphenylene oxide, polyphenylene sulfide, polyamide, polyimide, polyetherimide, polyetherimide/silicone block copolymer, polyurethane, polyester, polycarbonate, acrylic resin such as polymethyl methacrylate, styrene)/acrylonitrile and styrene block copolymers.

The rubber may be nitrile-butadiene rubber (NBR), such as carboxy-terminated polybutadieneacrylonitrile (CTBN), amino-terminated polybutadieneacrylonitrile (ATBN), hydroxy-terminated to polybutadieneacrylonitrile epoxy-terminated polybutadieneacrylonitrile (ETBN), vinyl-terminated polybutadieneacrylonitrile (VTBN), or methacrylic-terminated polybutadieneacrylonitrile.

The curing temperature of the curing agent in the adhesive material of the present invention is higher than 120° C., or preferably at about 150° C., to cure (crosslink) or catalyze polymerize the thermoset epoxy resin. The curing agent is preferably dicyandiamide and may be used together with a curing accelerator. The commonly used curing accelerator includes urea or urea compounds, imidazole, or boron trifluoride. Moreover, the curing agent may be isophthaloyl dihydrazide, benzophenone tetracarboxylic dianhydride, diethyltoluene diamine, 3,5-dimethylthio-2,4-toluene diamine, dicyandiamide, or diaminodiphenyl sulfone (DDS). The curing agent may be substituted dicyandiamides, such as 2,6-xylenyl biguanide, solid polyamide, solid aromatic amine, solid anhydride hardener, phenolic resin hardener. For example, polyp-hydroxy styrene), amine complex, trimethylol propane triacrylate, bismaleimides or cyanate esters. In an embodiment, the curing agent and the curing accelerator, together with the polymeric component, comprises 15-60% by volume of the adhesive material.

The heat conductive filler may comprise one or more ceramic powders that can be selected from nitride, oxide or the mixture thereof. The nitride can be selected from the group consisting essentially of zirconium nitride, boron nitride, aluminum nitride, and silicon nitride. The oxide can be selected from the group consisting essentially of aluminum oxide, magnesium oxide, zinc oxide, silicon dioxide and titanium dioxide. In general, heat conductivity of oxide is relatively low, whereas the filling amount of nitride is relatively low. Therefore, oxide and nitride can be complementary to each other when they are mixed. The heat conductive filler is evenly dispersed in the polymeric component and comprises 40-85%, and preferably 50-70%, by volume of the adhesive material. In particular, the heat conductive filler may comprise 50%, 55%, 60%, 65%, 70% or 80% by volume of the adhesive material.

The IMS manufactured by the above-said method undergoes cycle test. An initial bonding strength before cycle test and a bonding strength after cycle test are measured, and appearance of IMS after cycle test is observed. The test results, which includes Comparative Examples 1 (CE1), and Embodiments 1-3 (E1-3), are shown in Table 1 below. The cycle test is conducted by putting IMS in an environment of −40° C. followed by 150° C. as a cycle with each temperature lasting for a duration of 30 minutes, and each cycle is repeated 1000 times. The electrically conductive line pattern layer is a copper layer with a thickness of 1 mm. The first and second adhesive layer each has a thickness of 50 μm. In general, the bonding strength between layers in IMS depends on several possible factors, including hot-pressing parameters, layer material or composition, surface roughness of each layer, etc. Generally, the higher the pressure applied by the hot presser, the larger the bonding strength between layers after hot-pressing. The test results show that, for E1-E3, as long as the bonding strength between layers after hot-pressing is greater than 80 kg/cm², the EMS can pass the cycle test without layer separation. For E1-E3, although, the bonding strength is decreased slightly after cycle test, these layers in the IMS are still firmly adhered to each other. In contrast, for CE1, if the bonding strength between layers after hot-pressing is less than 80 kg/cm², such as 60 kg/cm² in CE1, separation or peeling occurs in the IMS, obviously reveling that the bonding strength between layers is not strong enough.

TABLE 1

| | Initial | Cycle test at −40°C./150°C. (executed for 1000 times) | |
|---|---|---|---|
| | Bonding strength (kg/cm²) | Appearance | Bonding strength (kg/cm²) |
| CE1 | 60 | Peeling | — |
| E1 | 80 | No abnormality | 75 |
| E2 | 120 | No abnormality | 116 |
| E3 | 150 | No abnormality | 143 |

Table 2 records the test results of Embodiments 47 (E4-E7), in which the IMS manufactured by the above-said method undergoes cycle test. An initial bonding strength before cycle test and a bonding strength after cycle test are measured, and appearance of IMS after cycle test is observed. Likewise, the cycle test is conducted by putting IMS in an environment of −40° C. followed by 150° C. as a cycle with each temperature lasting for a duration of 30 minutes, and each cycle is repeated 1000 times. The electrically conductive line pattern layers in E4-E7 have different thicknesses, i.e., 0.3 mm, 1 mm, 5 mm and 10 mm, respectively. The first and second adhesive layer each has a thickness of 50 μm. The test result shows that E4-E7 where the IMS includes an electrically conductive line pattern layer having a thickness falling within 0.3-10 mm still can pass the cycle test, and there is no peeling phenomenon occurring between the first adhesive layer and the electrically conductive line pattern layer. In addition, the thicker the electrically conductive line pattern layer, the more the decreased bonding strength after cycle test. For example, for E7, the electrically conductive line pattern layer has a thickness of 10 mm; however, the bonding strength after cycle test drops 25% as opposed to that there is no cycle test performed on IMS, i.e. dropping from 80 kg/cm² to 60 kg/cm². But, there is still not any peeling phenomenon occurring. Apparently, this proves that the present invention is quite suitable for applications in which the electrically conductive line pattern layer is a thick copper layer having a thickness of 03-10 mm,

TABLE 2

| | Thickness of electrically conductive line pattern layer (mm) | Initial Bonding strength (kg/cm²) | Cycle test at −40°C./150°C. (executed for 1000 times) | |
|---|---|---|---|---|
| | | | Appearance | Bonding strength (kg/cm²) |
| E4 | 0.3 | 80 | No abnormality | 78 |
| E5 | 1 | 80 | No abnormality | 75 |
| E6 | 5 | 80 | No abnormality | 70 |
| E7 | 10 | 80 | No abnormality | 60 |

Tables 1 and 2 show the test results conducted on the IMS including a first adhesive layer and a second adhesive layer with each layer having a thickness of 50 μm. In practice, the first and second adhesive layer each may have a thickness of 25-100 μm, such as 40 μm, 60 μm or 80 μm. Such thickness would not cause peeling.

In summary, in high power applications, an electrically conductive line pattern layer 14 of a large thickness, e.g., 0.3-10 mm, made of copper is usually used. Moreover, a heat sink element 20 having protrusions 22 are generally used as well. However, the traditional method for manufacturing IMS having such structure design would result in peeling problem between layers. In contrast thereto, the present invention provides a method for manufacturing an IMS which includes a series of steps to improve bonding strength between layers. Specifically, a thermal conductive substrate that has been hot-pressed is provided first, therefore the bonding strength between the metal layer and the first adhesive layer is excellent. Moreover, because the first adhesive layer and the second adhesive layer have the same or similar composition, hot-pressing step makes the two layers tightly bond to each other. Thus, despite of inclusion of protrusion 22 in the heat sink element 20, superior bonding strength would not cause separation problem. In addition, the adhesive material used to form the first and second adhesive layer 12 and 31 is prepared by including plural ingredients to have a heat conductivity greater than 3 W/m-K, and the adhesive material in the form of a plate with a thickness of 100 μm has a thermal resistance below 0.5° C./W, which is measured according to ASTM 5470. Further, the adhesive material is insulative and can withstand 500 volts or more. The adhesive layer made from the adhesive material also has a glass transition temperature Tg greater than 150° C. Therefore, for theses reasons, the present invention is particularly suitable for high power applications. Additionally, the present invention uses Computer Numerical Control (CNC) to remove a portion of the metal layer 13, thus effectively avoiding misalignment problem and increasing product yield.

Additionally, the present invention provides an IMS 300. Please see FIG. 3. The IMS 300 comprises an electrically conductive line pattern layer 14, an encapsulation layer 15, a first adhesive layer 12, a second adhesive layer 31 and a heat sink element 20. The encapsulation layer 15 fills a gap 141 between a plurality of electrically conductive lines 142 of the electrically conductive line pattern layer 14, and an upper surface of the encapsulation layer 15 is flush with an upper surface of the electrically conductive line pattern layer 14. The heat sink element 20 is disposed below the electrically conductive line pattern layer 14 and the encapsulation layer 15. The first adhesive layer 12 and the second adhesive layer 31 are disposed between the electrically conductive line pattern layer 14 and the heat sink element 20. The first adhesive layer 12 physically contacts the electrically conductive line pattern layer 14 and the encapsulation layer 15, and the second adhesive layer 31 physically contacts the heat sink element 20. A bonding strength between the first adhesive layer 12 and the second adhesive layer 31 is greater than 80 kg/cm².

Figure 3:
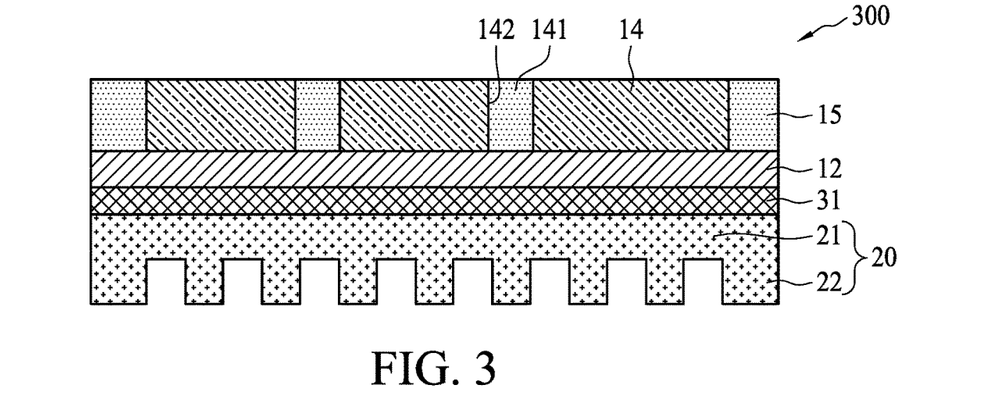
FIG. 3 shows a cross-sectional view of an IMS in accordance with an embodiment of the present invention.

In an embodiment, the electrically conductive line pattern layer 14 comprises copper, and has a thickness of 0.3-10 mm, such as 0.5 mm, 1 mm, 2 mm, 3 mm, 4 mm, 5 mm, 6 mm, 7 mm, 8 mm or 9 mm.

A bonding strength between the first adhesive layer 12 and the electrically conductive line pattern layer 14 is greater than 80 kg/cm², or greater than 100 kg/cm² or 120 kg/cm² in particular.

The composition of the first adhesive layer 12 and the second adhesive layer 31 has been described in the embodiment of FIG. 2, and is omitted here. Both the first adhesive layer 12 and the second adhesive layer 31 serve as a thermally conductive and electrically insulating medium for the IMS. The first adhesive layer 12 and the second adhesive layer 31 may be hot-pressed to bond to each other and physically contact each other, such that, after hot-pressing, an interface is formed between the first adhesive layer 12 and the second adhesive layer 31, and a superior bonding strength such as 80-300 kg/cm², or 100 kg/cm², 150 kg/cm², 200 kg/cm², or 250 kg/cm² in particular, between the first adhesive layer 12 and the second adhesive layer 31 is established. That is, the interface between the first adhesive layer 12 and the second adhesive layer 31 has a superior bonding strength falling within the range of 80-300 kg/cm². Also, each of the first adhesive layer 12 and the second adhesive layer 31 has a glass transition temperature Tg greater than 150° C.

In an embodiment, in order to improve heat dissipation efficiency by increasing heat dissipation area, the heat sink element 20 may include a main plate 21 and a plurality of protrusions 22. The protrusions 22 project outwardly along the direction that is vertical to an extending direction of the main plate 21. The protrusions 22 could be in shape of cylinder, elliptic cylinder, polygonal column, truncated cone or flat plate. In addition, there is a gap between the protrusions 22 to accommodate air to flow therein, so as to carry heat away. Alternatively, the heat sink element 20 could include the main plate 21 solely, that is, without the protrusions 22. The main plate 21 in this case is thicker than that of the heat sink element 20 including protrusions 22. The main plate 21 having thicker thickness may facilitate heat conduction along both horizontal direction and vertical direction of the plate 21, so that, afterwards, heat could be effectively dissipated to ambient environment to achieve efficient heat dissipation.

The present invention provides an IMS and a method for manufacturing the same. A thermal conductive substrate that has been hot-pressed is provided first, therefore the bonding strength between the metal layer and the first adhesive layer is excellent. Also, a mechanical way is used to remove a portion of the metal layer, thus avoiding the misalignment problem. Moreover, because the first adhesive layer and the second adhesive layer have the same or similar composition, hot-pressing step makes the two layers tightly bond to each other. Thus, according to the present invention, there is not any separation phenomenon occurring between layers of IMS, and misalignment problem is solved as well. The IMS has good heat conductivity and high glass transition temperature Tg as well. Therefore, the present invention is particularly suitable for high power applications, thus providing a solution to the traditional IMS Which encounters the problems as described above.

The above-described embodiments of the present invention are intended to be illustrative only. Numerous alternative embodiments may be devised by persons skilled in the art without departing from the scope of the following claims.

What is claimed:

1. An insulated metal substrate, comprising:
   an electrically conductive line pattern layer;
   an encapsulation layer filling a gap between a plurality of electrically conductive lines of the electrically conductive line pattern layer, wherein an upper surface of the encapsulation layer is flush with an upper surface of the electrically conductive line pattern layer;
   a first adhesive layer;
   a second adhesive layer; and
   a heat sink element disposed below the electrically conductive line pattern layer and the encapsulation layer,
   wherein the first adhesive layer and the second adhesive layer are disposed between the electrically conductive line pattern layer and the heat sink element, the first adhesive layer physically contacts the electrically conductive line pattern layer and the encapsulation layer, and the second adhesive layer physically contacts the heat sink element,
   wherein there is an interface between the first adhesive layer and the second adhesive layer, the first adhesive layer physically contacts the second adhesive layer, and a bonding strength between the first adhesive layer and the second adhesive layer is greater than 80 kg/cm²,
   wherein the electrically conductive line pattern layer has a thickness of 0.3-10 mm,
   wherein the first adhesive layer and the second adhesive layer have a same or different composition,
   wherein both the first adhesive layer and the second adhesive layer are made from an adhesive material, the adhesive material comprising:
      a polymeric component comprising 15-60% by volume of the adhesive material, and comprising thermoset epoxy resin and polymeric modifier configured to improve impact resistance of the thermoset epoxy resin, the polymeric modifier comprising thermoplastic, rubber or the mixture thereof; and the polymeric modifier comprising 4%-45% by volume of the polymeric component;

a heat conductive filler evenly dispersed in the polymeric component, and comprises 40-85% by volume of the adhesive material;

a curing agent configured to cure the thermoset epoxy resin at a temperature higher than 120° C.; and a curing accelerator including urea or urea compounds, and wherein the adhesive material has a heat conductivity greater than 3 W/m-K.

2. The insulated metal substrate of claim 1, wherein the electrically conductive line pattern layer comprises copper.

3. The insulated metal substrate of claim 1, wherein a bonding strength between the first adhesive layer and the electrically conductive line pattern layer is greater than 80 kg/cm², and a bonding strength between the second adhesive layer and the heat sink element is greater than 80 kg/cm².

4. The insulated metal substrate of claim 1, wherein each of the first adhesive layer and the second adhesive layer has a glass transition temperature Tg greater than 150° C.

5. The insulated metal substrate of claim 1, wherein each of the first adhesive layer and the second adhesive layer has a thickness of 25-100 μm, and the bonding strength between the first adhesive layer and the second adhesive layer falls within the range of 80-300 kg/cm².

6. The insulated metal substrate of claim 1, wherein the adhesive material in the form of a plate with a thickness of 100 μm has a thermal resistance below 0.5° C./W and withstands 500 volts or more.

7. The insulated metal substrate of claim 1, wherein the heat conductive filler comprises one or more ceramic powders.

8. The insulated metal substrate of claim 1, wherein the heat conductive filler is selected from the group consisting of zirconium nitride, boron nitride, aluminum nitride, silicon nitride, aluminum oxide, magnesium oxide, zinc oxide, silicon oxide, titanium oxide and the mixture thereof.

9. The insulated metal substrate of claim 1, wherein the heat sink element comprises a main plate and a plurality of protrusions, and the protrusions project outwardly along a direction that is vertical to an extending direction of the main plate.

* * * * *